(12) United States Patent
Kondo et al.

(10) Patent No.: US 8,042,263 B2
(45) Date of Patent: Oct. 25, 2011

(54) PROCESS FOR MANUFACTURING CIRCUIT BOARD

(75) Inventors: Masayoshi Kondo, Akita (JP); Toshio Komiyatani, Akita (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 635 days.

(21) Appl. No.: 12/160,718

(22) PCT Filed: Feb. 8, 2007

(86) PCT No.: PCT/JP2007/000069
§ 371 (c)(1),
(2), (4) Date: Jul. 11, 2008

(87) PCT Pub. No.: WO2007/094129
PCT Pub. Date: Aug. 23, 2007

(65) Prior Publication Data
US 2010/0212937 A1    Aug. 26, 2010

(30) Foreign Application Priority Data

Feb. 13, 2006    (JP) .................................. 2006-035120

(51) Int. Cl.
*H01R 43/00*    (2006.01)

(52) U.S. Cl. ................ 29/825; 29/830; 29/832; 29/847; 29/852

(58) Field of Classification Search .................... 29/825, 29/832, 831, 830, 852, 846, 847; 228/180.222, 228/245, 254, 123; 361/683; 174/254
See application file for complete search history.

(56) References Cited

U.S. PATENT DOCUMENTS

| | | | | |
|---|---|---|---|---|
| 5,768,109 A | * | 6/1998 | Gulick et al. | 361/794 |
| 6,410,415 B1 | * | 6/2002 | Estes et al. | 438/612 |
| 6,692,793 B2 | * | 2/2004 | Sato et al. | 427/510 |
| 6,821,878 B2 | * | 11/2004 | Danvir et al. | 438/613 |
| 2004/0105223 A1 | | 6/2004 | Okada et al. | |
| 2010/0044648 A1 | * | 2/2010 | Obata et al. | 252/512 |
| 2010/0203307 A1 | * | 8/2010 | Komiyatani et al. | 428/220 |

FOREIGN PATENT DOCUMENTS

| | | |
|---|---|---|
| CN | 1498520 | 5/2004 |
| JP | 8-195560 | 7/1996 |
| JP | 8-316598 | 11/1996 |
| JP | 11-54934 | 2/1999 |
| JP | 2002-111216 | 4/2002 |
| JP | 2004-104030 | * 2/2004 |
| JP | 2005-167032 | * 6/2005 |
| JP | 2005-277011 | 10/2005 |
| WO | WO 02/076161 | 9/2002 |

* cited by examiner

*Primary Examiner* — Derris H Banks
*Assistant Examiner* — Tai Nguyen
(74) *Attorney, Agent, or Firm* — Ditthavong Mori & Steiner, P.C.

(57) ABSTRACT

According to the present invention, there is provided a process for manufacturing a circuit board wherein a first substrate having a conductor post and a second substrate having a conductor pad for receiving the conductor post are laminated through an interlayer adhesive, and the conductor post and the conductor pad are electrically connected, comprising, as a first step, bonding the conductor pad with the conductor post by thermocompression under predetermined first conditions while the first and the second substrates are arranged such that the conductor pad faces the conductor post through the interlayer adhesive; thermocompressing the first substrate and the second substrate under predetermined second conditions while the conductor pad is bonded with the conductor post; and thermocompressing the first substrate and the second substrate under predetermined third conditions while the conductor pad is bonded with the conductor post, wherein the first, the second and the third conditions are different from each other.

17 Claims, 2 Drawing Sheets

PROCESS FOR MANUFACTURING CIRCUIT BOARD

TECHNICAL FIELD

The present invention relates to a process for manufacturing a circuit board and a circuit board.

BACKGROUND ART

Recent density increase in electronic devices has accelerated multilayering of a circuit board used in these devices such as a flexible printed circuit board. A build-up method is generally employed for laminating such a multilayer circuit board. A build-up method refers to a method for forming interlayer connection between monolayers while piling up resin layers made of a resin alone and conductor layers.

The build-up methods can be generally categorized into those where a via hole is formed in resin layers before forming an interlayer connection and those where an interlayer connection is formed before laminating resin layers. Methods for forming an interlayer connection are categorized into formation of a via hole by plating and formation using a conductive paste.

There has been disclosed a technique allowing for stacked-via and density increase and simplification of an interconnection design, wherein a fine via hole for interlayer connection is formed in a resin layer by laser and the via hole is filled with a conductive adhesive such as a copper paste, by which electric connection is formed (for example, see Japanese Laid-open Patent Publication No. 1996-316598).

However, the above method may not provide adequately reliable interlayer electric connection because the connection is formed via a conductive adhesive. Furthermore, the method requires an advanced technique for filling a fine via hole with a conductive adhesive and thus cannot cope with further miniaturization of an interconnection pattern.

Thus, instead of filling a via hole with a conductive adhesive, there has been employed a technique where a metal protrusion (a conductor post) is used. However, even in a case where a conductor post is used, there has been disclosed a method where while forming an interlayer connection, a conductor post physically removes an interlayer adhesive for forming connection with a conductor pad (for example, see Japanese Laid-open Patent Publication No. 1999-54934).

However, this method cannot completely remove the interlayer adhesive between the conductor post and the conductor pad, which may lead to inadequately reliability.

Alternatively, there has been proposed a method wherein using the above conductor post with a solder layer on the tip, the conductor post penetrates an uncured resin layer and an uncured adhesive layer at a temperature lower than a melting point of the solder, and then the conductor pad is pressed at about 2.5 MPa, and then the adhesive layer is cured and then the solder is fused and cooled to form a solder bonding (for example, see Japanese Laid-open Patent Publication No. 1996-195560).

However, such manufacturing a circuit board by forming interlayer connection by compression may lead to phenomena such as distortion in an internal layer circuit and corrugation of a circuit board due to distortion of an internal layer circuit. In particular, there is a tendency that the larger number of piled internal circuits leads to more significant distortion or corrugation.

Patent Document 1: Japanese Laid-open Patent Publication No. 1996-316598

Patent Document 2: Japanese Laid-open Patent Publication No. 1999-54934

Patent Document 3: Japanese Laid-open Patent Publication No. 1996-195560

DISCLOSURE OF THE INVENTION

In view of the above situation, an objective of the present invention is to provide a process for manufacturing a circuit board via interlayer connection, without distortion in an internal circuit or corrugation in an internal layer substrate.

According to the present invention, there is provided a process for manufacturing a circuit board where a first substrate having a conductor post and a second substrate having a conductor pad for receiving the conductor post are laminated through an interlayer adhesive, and the conductor post and the conductor pad are electrically connected, comprising, as a first step, bonding the conductor pad with the conductor post by thermocompression under predetermined first conditions while the first and the second substrates are arranged such that the conductor pad faces the conductor post through the interlayer adhesive; thermocompressing the first substrate and the second substrate under predetermined second conditions while the conductor pad is bonded with the conductor post; and thermocompressing the first substrate and the second substrate under predetermined third conditions while the conductor pad is bonded with the conductor post, wherein the first, the second and the third conditions are different from each other.

According to the present invention, bonding between the first substrate and the second substrate is conducted through the above three steps. These three steps allows for favorable interconnection without a remaining interlayer adhesive between the conductor pad and the conductor post.

In a preferred embodiment, the interlayer adhesive is removed between the conductor post and the conductor pad in the first step; the conductor post forms a fillet in the second step; and the conductor post and the conductor pad alloy in the third step.

The present invention includes the steps under the predetermined conditions optimal for removing the interlayer adhesive, forming the fillet and forming an alloy. Thus, there can be manufactured a circuit board without distortion in an internal layer circuit or corrugation in an internal layer substrate.

BRIEF DESCRIPTION OF THE DRAWINGS

The abovementioned and other objectives, features and advantages will be more clearly understood with reference to the suitable embodiments and the accompanying drawings described below.

BEST MODE FOR CARRYING OUT THE INVENTION

There will be described embodiments of the present invention with reference to the drawings. In all of the drawings, a common element is denoted by the same symbol and may not be mentioned as appropriate.

FIGS. 1 to 4 are cross-sectional view illustrating one embodiment of a manufacturing process for a circuit board 20 according to the present invention.

Figure 1:
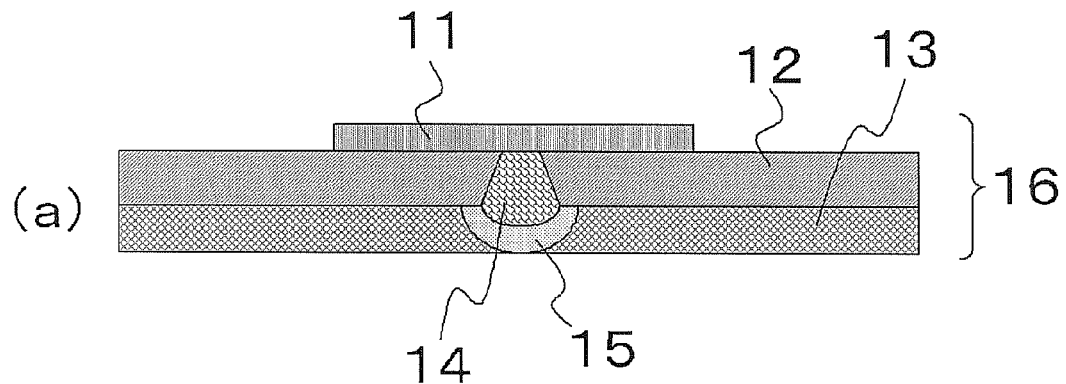
FIG. 1 is a cross-sectional view illustrating a first and a second substrates.
Figure 1:
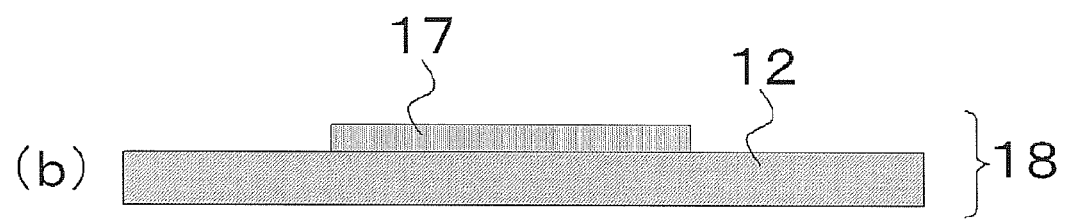
Figure 2:
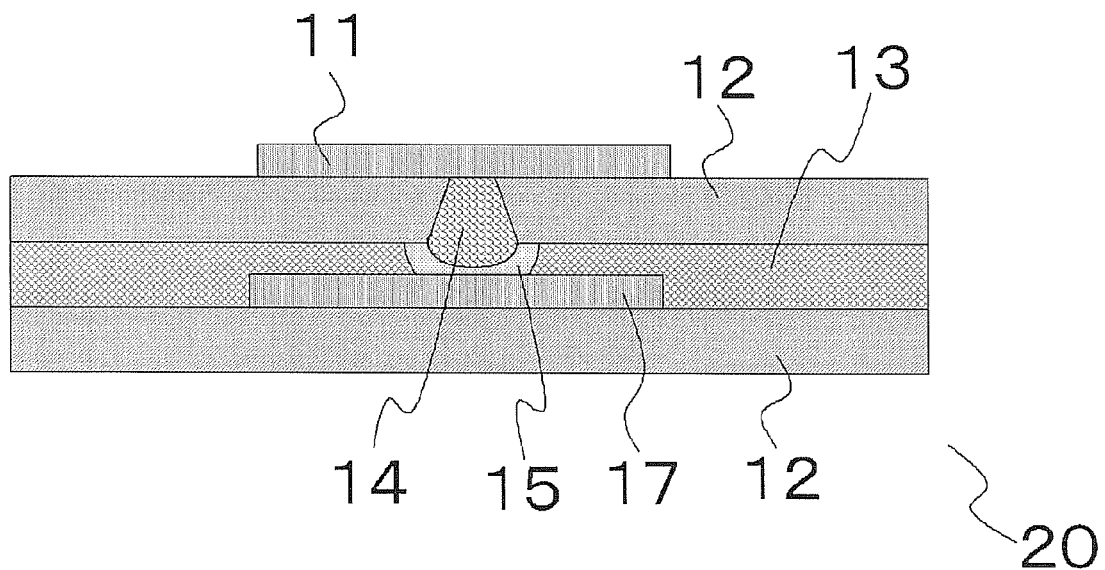
FIG. 2 is a cross-sectional view illustrating a first step.
Figure 3:
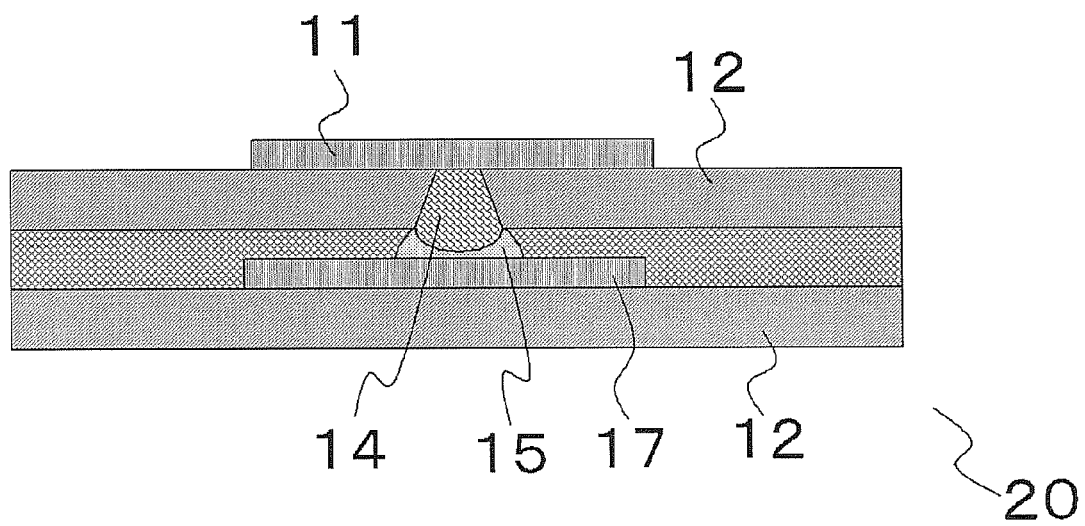
FIG. 3 is a cross-sectional view illustrating a second step.
Figure 4:
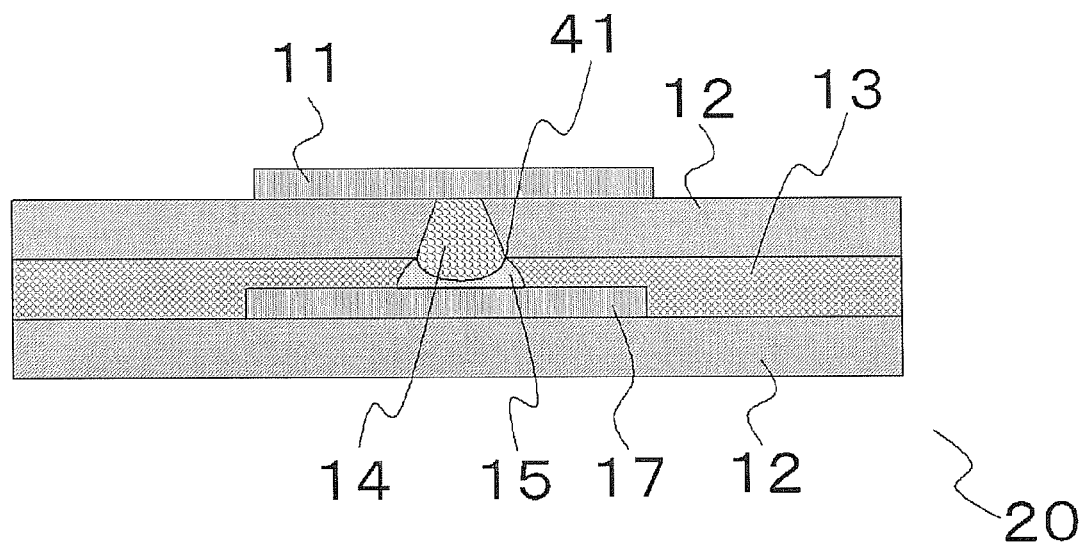
FIG. 4 is a cross-sectional view illustrating a third step.

FIGS. 1(a) and 1(b) are cross-sectional views of the first and the second substrates, respectively. FIGS. 2, 3 and 4 are cross-sectional views if the first, the second and the third steps, respectively.

A process for manufacturing a circuit board 20 according to one embodiment of the present invention is a process for manufacturing a circuit board where a first substrate 16 having a conductor post 14 and a second substrate 18 having a conductor pad 17 for receiving the conductor post 14 are laminated and adhered through an interlayer adhesive 13, and the conductor post 14 and the conductor pad 17 are electrically connected, comprising, as a first step, bonding the conductor pad 17 with the conductor post 14 under predetermined first conditions while the first substrate 16 and the second substrate 17 are arranged such that the conductor pad 17 faces the conductor post 14 through the interlayer adhesive 13 (FIG. 2); retaining the product under predetermined second conditions while the conductor pad 17 is bonded with the conductor post 14 (FIG. 3); and retaining the product under predetermined third conditions while the conductor pad 17 is bonded with the conductor post 14. Here, the first, the second and the third conditions are different from each other in a temperature and a pressure.

There will be described the individual steps.

A first substrate 16 having a conductor post 14 and a second substrate 18 having a conductor pad 17 for receiving the conductor post 14 are prepared (FIGS. 1(a), (b)).

Examples of the first and the second base materials 12 include resin films such as polyimide films, polyether ether ketone films, polyether sulfone films and liquid crystal polymer films; and laminate plates such as epoxy resin laminate plates, phenol resin laminate plates and cyanate resin laminate plates. Among these, preferred is a resin film represented by a polyimide film. Thus, heat resistance can be improved. Furthermore, flexibility may be given.

A thickness of the first and the second base materials 12 is, but not limited to, preferably 9 to 50 μm, particularly preferably 12 to 25 μm. With a thickness within the above range, a plating time for forming the conductor post 14 can be reduced.

Materials for the first conductor circuit 11 and the conductor pad 17 may include a copper foil and aluminum. Among these, preferred is a copper foil. A thickness is, but not limited to, preferably 5 to 50 μm, particularly preferably 9 to 35 μm. A thickness within the above range may particularly lead to favorable circuit formation by etching. Furthermore, it may improve handling (handling properties) of the first base material 12 after forming the first conductor circuit 11.

A material for the interlayer adhesive 13 may be, for example, an epoxy resin adhesive or an acrylic resin adhesive, and among these, an epoxy resin adhesive having flux activity is preferable. Thus, it can provide particularly excellent adhesiveness to the first base material 12 of the polyimide film.

A thickness of the interlayer adhesive 13 is, but not limited to, preferably 8 to 30 μm, particularly preferably 10 to 25 μm. With a thickness within the range, both adhesiveness and prevention of exudation of the adhesive can be particularly improved.

The interlayer adhesive 13 can be applied to the first base material 12 as a liquid or by thermocompression using a vacuum laminator and the latter is more convenient and gives a more stable thickness of the interlayer adhesive 13.

As the conductor post 14, a copper post formed is, for example, formed using a paste or by plating. Subsequently, a metal covering layer 15 is formed from, for example, an alloy. There are no particular restrictions to a height of the conductor post 14, but a protrusion is preferably 2 to 30 μm, particularly preferably 5 to 15 μm from the opposite side to the side where the first conductor circuit 11 made of the first base material 12 is formed. With a height within the above range, connection between the conductor post 14 and the conductor pad 17 can be stable.

The metal covering layer 15 is, for example, made of a metal or alloy. The metal is preferably, for example, tin. The alloy is preferably a metal covering layer 15 made of at least two metals selected from tin, lead, silver, zinc, bismuth, antimony and copper. Examples include tin-lead, tin-silver, tin-zinc, tin-bismuth, tin-antimony, tin-silver-bismuth and tin-copper alloys, but an optimal alloy may be selected without being limited to a particular combination or composition of metals. A thickness of the metal covering layer is, but not limited to, preferably 2 μm or more, particularly preferably 3 to 20 μm. With a thickness within the range, connection between the conductor post 14 and the conductor pad 17 is stable, resulting in improved reliability.

There will be described the first step (FIG. 2). In the first step, the interlayer adhesive 13 between the metal covering layer 15 and the conductor pad 17 is removed to form electric connection of the first substrate 16 with the second substrate 18.

Preliminarily, the first substrate 16 and the second substrate 18 are aligned, for example, by alignment while reading a mark formed as a conductor pattern using an image recognition device or by alignment using a pin. The aligned substrate is pressed at a predetermined temperature and a predetermined pressure under a reduced pressure.

The predetermined temperature is preferably 210 to 220° C., particularly preferably 215 to 220° C. With a temperature within the range, the interlayer adhesive 13 gets soft while the metal covering layer 15 is not melted yet, so that the interlayer adhesive 13 between the metal covering layer 15 and the conductor pad 17 can be removed. With a temperature lower the above range, the interlayer adhesive 13 is insufficiently softened, and with a temperature higher than the range, the metal covering layer 15 melts, leading to incomplete removal of the interlayer adhesive 13.

The predetermined pressure is preferably 1 to 4 MPa, particularly preferably 1.5 to 3 MPa. With a pressure within the range, the interlayer adhesive 13 between the metal covering layer 15 and the conductor pad 17 can be removed. With a pressure lower than the range, the interlayer adhesive 13 cannot be completely removed. With a pressure higher than the range, the first substrate 16 and the second substrate 18 may be distorted and due to the distortion, the substrate may be corrugated. Furthermore, it may lead to increased exudation of the interlayer adhesive and instability in an interlayer thickness. Under the above conditions, the interlayer adhesive 13 between the metal covering layer 15 and the conductor pad 17 can be properly removed and the remaining interlayer adhesive 13 can form robust connection between the first substrate 16 and the second substrate 18.

There will be described the second step (FIG. 3). In the second step, the metal covering layer 15 melts to form a fillet shape. Formation of the fillet improves physical strength of the conductor pad 17 and the metal covering layer 15.

A temperature is preferably 215 to 225° C., particularly preferably 221 to 225° C. With a temperature within the range, the metal covering layer 15 melts to form a favorable fillet, resulting in stable electric connectivity between the first substrate 16 and the second substrate.

A pressure is preferably 0.3 to 2 MPa, particular preferably 0.8 to 1.5 MPa. With a pressure within the range, a fillet can be stably formed. Furthermore, when the metal covering layer 15 has melted while a pressure is within the above range, distortion, if any, formed in first step between the first substrate 16 and the second substrate 18 can be reduced.

A total processing time of the first step and the second step is preferably 20 sec or more and 120 sec or less, particularly preferably 25 to 45 sec. With the processing time less than the above range, the interlayer adhesive 13 may be unremoved. With the processing time more than the above range, the interlayer adhesive 13 may be cured, so that a fillet cannot be formed from the metal covering layer 15.

There will be described the third step (FIG. 4). In the third step, a metal alloy layer 41 is formed between the metal covering layer 15 and the conductor post 14 and the conductor pad 17.

A temperature is preferably 240 to 280° C., particularly preferably 250 to 270° C. With the temperature within the range, a stable metal alloy layer can be formed, resulting in improved reliability in electric connection between the first substrate 16 and the second substrate.

A pressure is preferably 0.3 to 2 MPa, particularly 0.8 to 1.5 MPa. With a pressure within the range, an internal stress in the substrate is reduced, so that dimensions are stable and no voids due to thermal contraction of the substrate are generated.

A processing time of the third step is preferably 1 to 10 min, particularly 3 to 8 min. With the processing time less than the range, formation of a metal alloy layer is difficult while with the processing time more than the range, an internal stress is generated in the substrate.

Although it is not essential to conduct the first to the third steps in sequence, such sequential processing is preferable because it leads to reduction of a working time and a stable substrate.

A temperature in the first to the third steps may be stepwise increased in the order. For example, the first, the second and the third step may be conducted at 218° C., 225° C. and 260° C., respectively.

There are no particular restrictions to a processing apparatus as long as predetermined temperature, pressure and processing time can be provided through the first to the third steps, including those using a hot plate pre-heated to a predetermined temperature or using a rapid heating heater.

Although there has been described the process for manufacturing a circuit board according to an embodiment of the present invention with reference to the drawings, these are only illustrative of the present invention, and various modes other than the above embodiment may be employed.

For example, in this embodiment, there has been described the step of laminating and bonding a first and a second substrates, but an alternative manufacturing process for a circuit board may be used, where a conductor pad is formed in the first substrate and a substrate having a conductor post is bonded to the upper layer of the first substrate. Thus, a plurality of layers may be, if necessary, added to a first or second substrate.

Next, there will be described an interlayer adhesive used in manufacturing a circuit board of the present invention.

An interlayer adhesive of the present invention contains a flux-active compound having a carboxyl group and/or a phenolic hydroxy group, a thermosetting resin and a film-forming resin. The individual components will be described below.

A flux compound having a carboxyl group and/or a phenolic hydroxy group refers to a compound having at least one carboxyl group and/or phenolic hydroxy group in one molecule, which may be liquid or solid.

Examples of a flux compound having a carboxyl group include aliphatic acid anhydrides, alicyclic acid anhydrides, aromatic acid anhydrides, aliphatic carboxylic acids and aromatic carboxylic acids. Examples of a flux-active compound having a phenolic hydroxy group include phenols.

Examples of an aliphatic acid anhydride include succinic anhydride, polyadipic acid anhydride, polyazelaic acid anhydride and polysebacic acid anhydride.

Examples of an alicyclic acid anhydride include methyltetrahydrophthallic anhydride, methylhexahydrophthallic anhydride, methylhimic anhydride, hexahydrophthallic anhydride, tetrahydrophthallic anhydride, trialkyltetrahydrophthallic anhydride and methylcyclohexenedicarboxylic acid anhydride.

Examples of an aromatic acid anhydride include phthallic anhydride, trimellitic anhydride, pyromellitic anhydride, benzophenone tetracarboxylic acid anhydride, ethylene glycol bistrimellitate and glycerin tristrimellitate.

An aliphatic carboxylic acid may be a compound represented by formula (1).

$$HOOC—(CH_2)_n—COOH \tag{1}$$

In formula (1), n is an integer of 0 or more and 20 or less. In the light of flux activity, outgassing during adhesion, and balance between an elastic modulus after curing an adhesive and a glass-transition temperature, "n" in formula (1) is preferably equal to or more than 3 and equal to or less than 10. When n is 3 or more, increase in an elastic modulus after curing the adhesive can be inhibited to improve its adhesiveness to an adherend. When n is 10 or less, reduction in an elastic modulus can be inhibited to further improve connection reliability.

Examples of a compound represented by formula (1) include glutaric acid ($HOOC—(CH_2)_3—COOH$; n=3), adipic acid ($HOOC—(CH_2)_4—COOH$; n=4), pimelic acid ($HOOC—(CH_2)_5—COOH$; n=5), sebacic acid ($HOOC—(CH_2)_8—COOH$; n=8) and $HOOC—(CH_2)_{10}—COOH$ (n=10).

Other examples of an aliphatic carboxylic acid include formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid and succinic acid.

Examples of an aromatic carboxylic acid include benzoic acid, phthalic acid, isophthalic acid, terephthalic acid, hemimellitic acid, trimellitic acid, trimesic acid, mellophanic acid, prehnitic acid, pyromellitic acid, mellitic acid, tolic acid, xylic acid, hemellitic acid, mesitylene acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid, phenolphthalin and diphenolic acid.

Examples of a flux-active compound having a phenolic hydroxyl group include monomers having a phenolic hydroxyl group such as phenol, o-cresol, 2,6-xylenol, p-cresol, m-cresol, o-ethylphenol, 2,4-xylenol, 2,5-xylenol, m-ethylphenol, 2,3-xylenol, mesytol, 3,5-xylenol, p-tert-butylphenol, catechol, p-tert-amylphenol, resorcinol, p-octylphenol, p-phenylphenol, bisphenol-A, bisphenol-F, bisphenol-AF, biphenol, diallylbisphenol-F, diallylbisphenol-A, trisphenol and tetrakisphenol; phenol novolac resins; o-cresol novolac resins; bisphenol-F novolac resins; and bisphenol-A novolac resins.

Since a flux-active compound is three-dimensionally incorporated in a reaction with a thermosetting resin such as an epoxy resin, it is preferably a compound having at least two phenolic hydroxyl groups capable of being added to an epoxy resin and at least one carboxyl group directly attached to an aromatic moiety and exhibiting flux effect to a metal oxide film in one molecule. Examples of such a compound include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid); naphthoic acid derivatives such as 1,4-dihydroxy-2-naphthoic acid, 3,5-dihydroxy-2-naphthoic acid and 3,7-dihydroxy-2-naphthoic acid; phenolphthalin; and diphenol acid.

These flux-active compounds may be used alone or in combination of two or more.

A blending rate of the flux-active compound is 1% by weight or more, preferably 5% by weight or more to the total amount of the compositions of an adhesive in the light of improving flux activity. A residual flux-active compound not being involved in a reaction with a thermosetting resin may cause migration. Therefore, for avoiding a residual flux-active compound not being involved in a reaction with a thermosetting resin, a blending rate of the flux-active compound is 30% by weight or less, preferably 25% by weight or less. Furthermore, when the rate is within the above range, an oxide film in a copper foil surface can be reduced to give a very strong and favorable bonding.

Examples of a thermosetting resin include epoxy resins, oxetane resins, phenol resins, (meth)acrylate resins, unsaturated polyester resins, diallyl phthalate resins and maleimide resins. Among others, epoxy resins are suitably used, which are excellent in curability and storage stability, and heat resistance, moisture resistance and chemical resistance of a cured product.

The epoxy resin used may be an epoxy resin which is either a solid or a liquid at room temperature. Furthermore, the resin may contain an epoxy resin which is a solid at room temperature and an epoxy resin which is a liquid at room temperature. Thus, freedom in designing melting behavior of the resin can be further improved.

Examples of an epoxy resin which is a solid at room temperature include, but not limited to, bisphenol-A type epoxy resins, bisphenol-S type epoxy resins, phenol novolac type epoxy resins, cresol novolac type epoxy resins, glycidylamine type epoxy resins, glycidyl ester type epoxy resins, trifunctional epoxy resins and tetrafunctional epoxy resins. More specifically, it may contain a solid trifunctional epoxy resin and a cresol novolac type epoxy resin.

An epoxy resin which is a liquid at room temperature may be a bisphenol-A type epoxy resin or a bisphenol-F type epoxy resin. These may be used in combination.

A blending rate of these thermosetting resins is preferably equal to or more than 25% and equal to or less than 75% by weight, more preferably equal to or more than 45% and equal to or less than 70% by weight to the total amount of the compositions of the adhesive. The rate within the above range may provide excellent curability and allows for designing favorable melting behavior.

A thermosetting resin may contain a curing agent. Examples of a curing agent include phenols, amines and thiols. When an epoxy resin is used as a thermosetting resin, phenols are suitably used in the light of good reactivity to the epoxy resin, a minimum dimensional change during curing and proper physical properties after curing (for example, heat resistance, moisture resistance and so on).

A phenol used as a curing agent is preferably, but not limited to, bi- or more functional in the light of physical properties of an adhesive after curing. Examples of such a phenol include bisphenol-A, tetramethylbisphenol-A, diallylbisphenol-A, biphenol, bisphenol-F, diallylbisphenol-F, trisphenol, tetrakisphenol, phenol novolacs and cresol novolacs. In the light of melt viscosity, reactivity with an epoxy resin and post-curing physical properties, phenol novolacs and cresol novolacs may be suitably used.

When using a phenol novolac as a curing agent, its blending rate is, for example, 5% by weight or more, preferably 10% by weight or more to the total amount of the components of the adhesive in the light of ensuring thermosetting resin curing. A residual phenol novolac not being involved in a reaction with an epoxy resin may cause migration. Therefore, for avoiding a residual material, it is 30% by weight or less, preferably 25% by weight or less.

When the thermosetting resin is an epoxy resin, a blending rate of the phenol novolac may be defined as an equivalent ratio to the epoxy resin. Specifically, an equivalent ratio of a phenol novolac to an epoxy resin is equal to or more than 0.5 and equal to or less than 1.2, preferably equal to or more than 0.6 and equal to or less than 1.1, more preferably equal to or more than 0.7 and equal to or less than 0.98. By adjusting an equivalent ratio of a phenol novolac resin to an epoxy resin to 0.5 or more, heat resistance and moisture resistance after curing can be ensured, and by adjusting the equivalent ratio to 1.2 or less, the amount of a residual phenol novolac resin not being involved in a reaction with an epoxy resin after curing can be reduced, resulting in excellent migration resistance.

Other examples of a curing agent may be, for example, an imidazole compound having a melting point of 150° C. or higher. If a melting point of the imidazole compound is too low, an adhesive resin is cured before powdery solder moves to an electrode surface, leading to unstable connection and deteriorated storage stability of the adhesive. A melting point of the imidazole compound is, therefore, preferably 150° C. or higher. Examples of an imidazole compound having a melting point of 150° C. or higher include 2-phenylhydroxyimidazole and 2-phenyl-4-methylhydroxyimidazole. There are no particular restrictions to the upper limit of a melting point of the imidazole compound, which can be appropriately selected, for example, depending on a bonding temperature of a circuit board.

When using an imidazole compound as a curing agent, its blending rate is, for example, equal to or more than 0.005% by weight and equal to or less than 10% by weight, preferably equal to or more than 0.01% by weight and equal to or less than 5% by weight to the total amount of the components of the adhesive. By adjusting a blending rate of the imidazole compound to 0.005% by weight or more, it can more effectively functions as a curing catalyst for a thermosetting resin to improve curability of an adhesive. Furthermore, adjusting a blending rate of the imidazole compound to 10% by weight or less, a melt viscosity of a resin is not so high at a melting temperature of the solder, resulting in a favorable solder junction structure. In addition, storage stability of the adhesive can be further improved.

These curing agents may be used alone or in combination of two or more.

Examples of a film-forming resin include phenoxy resins, polyester resins, polyurethane resins, polyimide resins, siloxane-modified polyimide resins, polybutadiene, polypropylene, styrene-butadiene-styrene copolymers, styrene-ethylene-butylene-styrene copolymers, polyacetal resins, polyvinylbutyral resins, polyvinylacetal resins, butyl rubbers, chloroprene rubbers, polyamide resins, acrylonitrile-butadiene copolymers, acrylonitrile-butadiene-acrylic acid copolymers, acrylonitrile-butadiene-styrene copolymers, polyvinyl acetate, Nylons and acrylic rubbers. These may be used alone or in combination of two or more.

When using a phenoxy resin as a film-forming resin, the phenoxy resin preferably has a number average molecular weight of 5000 to 15000. By using such a phenoxy resin, fluidity of an adhesive before curing can be reduced to make an interlayer thickness uniform. A phenoxy resin framework may be, but not limited to, of a bisphenol-A, bisphenol-F or biphenyl type. A phenoxy resin with a saturated water absorption of 1% or less is preferable because foaming or detachment can be prevented at an elevated temperature during joining or solder mounting.

Furthermore, by way of improving adhesiveness and compatibility with another resin, a resin having nitrile, epoxy, hydroxy and/or carboxyl can be used as the above film-forming resin, and such a resin may be, for example, an acrylic rubber.

When using an acrylic rubber as a film-forming resin, film-deposition stability can be improved during preparing a film adhesive. Furthermore, an elastic modulus of an adhesive can be reduced and a residual stress between an adherend and an adhesive can be reduced, to improve adhesiveness to the adherend.

A blending rate of the film-forming resin may be, for example, equal to or more than 5% by weight and equal to or less than 45% by weight to the total amount of the components of an adhesive. When the film-forming resin is contained within the above range, deterioration in deposition properties can be prevented and increase in an elastic modulus of the adhesive after curing is prevented, so that adhesiveness to an adherend can be further improved. Furthermore, the rate within the above range allows for prevention of increase in a melt viscosity of the adhesive.

An adhesive of the present invention may further contain a silane coupling agent. By adding a silane coupling agent, the adhesive can have further improved adhesiveness to an adherend. Examples of the silane coupling agent include epoxysilane coupling agents and aromatic-containing aminosilane coupling agents. These may be used alone or in combination of two or more. A blending rate of the silane coupling agent may be, for example, 0.01 to 5% by weight to the total amount of the components of an adhesive.

Furthermore, this adhesive may contain components other than those described above. For example, a variety of additives may be appropriately added for improving various properties of a resin such as compatibility, stability and workability.

There will be described a process for manufacturing an adhesive of the present invention. The adhesive can be prepared by blending a flux-active compound, a thermosetting resin and a film-forming resin and drying it at a predetermined temperature.

In one embodiment of the present invention, an adhesive is characterized in that when an adhesive is applied to the surface of an oxidized copper plate and is reduced at 230° C. for one minute in the air, a copper-oxide reduction rate of the copper plate represented by equation (1) is 70% or more. The flux-active compound is capable of reducing an oxide film on the electrode surface in the circuit board and thus removing the oxide film. A reduction rate for a copper oxide adequate to remove the oxide film for preventing defective connection from occurring is 70% or more. Furthermore, in the light of improvement in a bonding probability and bond reliability under various circumstances after bonding, a reduction of a copper oxide is preferably 75% or more, more preferably 80% or more.

Next, there will be described the conditions of reduction of the copper oxide (230° C., one minute). Since reduction of the copper oxide in the flux-active compound is initiated at a temperature higher than the melting point of the flux-active compound, a temperature of reduction of the copper oxide can be appropriately adjusted, depending on the flux-active compound. On the other hand, for the interlayer connection in a circuit board, a lead-free solder such as Sn/3.5Ag (221° C.), Sn-3.0Ag-0.5Cu (217° C.) and Sn-58Bi (139° C.) is used and most of these have a melting point of 230° C. or lower. Therefore, in this embodiment of the present invention, a reduction temperature for a copper oxide is 230° C. A reduction time is one minute in the light of a time for adequate melting of the flux-active compound for wetting the surface of the copper oxide and initiating reduction and furthermore variation in reduction.

A copper-oxide (CuO) reduction rate is represented by equation (1) and can be determined by the following measuring method.

Definition $$\text{Copper-oxide reduction rate (\%)} = \{1-(\text{O atom concentration after reduction})/(\text{O atom concentration after oxidation})\} \times 100 \quad \text{Equation (1)}$$

Measuring Method (1) A copper plate with a thickness of 70 μm (Mitsui Mining And Smelting Company, Limited, 3EC-3, thickness: 2 to 3 μm) is soft-etched with a commercially available etchant.

(2) The soft-etched copper plate is oxidized in the air in an oven at 220° C. for 30 min.

(3) An adhesive is applied to thickness of 25 μm on the surface of the oxidized copper plate, and is subjected to reduction in the air at 230° C. for one minute.

(4) Within one minute after the reduction of Step (3), the adhesive components remaining on the surface of the reduced copper plate are removed by acetone.

(5) The copper plate after removing the resin components is immediately transferred to a vacuum desiccator and vacuum dried for drying the copper plate surface. The copper plate is stored under vacuum until ESCA measurement.

(6) The just oxidized copper plate and the surface of the reduced copper plate to a depth of 40 Å are removed by plasma treatment. Then, Cu and O atom concentrations are determined by ESCA (ULVAC-PHI Inc.). The plasma treatment and the ESCA measurement are conducted under a vacuum atmosphere. Removal of the surface of the copper plate to a depth of 40 Å by plasma treatment is for eliminating influence of an oxidized surface during handling for measurement.

The measurement conditions of ESCA used are as follows:
(i) Photoelectron take-off angle: 45 deg
(ii) X-ray source: AlKα-ray (monochrome)
(iii) Analysis range: 0.8 mmΦ

(7) A reduction rate of the copper oxide is calculated using equation (1).

In an embodiment of the present invention, an adhesive is characterized in that when placing a tin-containing solder ball with a diameter of 500 μm on the adhesive and is heated at a temperature of 30° C. higher than the melting point of the solder ball for 20 sec, a solder wet spread rate represented by equation (2) is 40% or more. The flux-active compound is capable of reducing an oxide film in a solder bump, reducing a surface tension of the solder and improving solder wettability. When using a solder bump for metal bonding of a circuit board, the larger a wet spread rate of the solder is, the stronger metal-metal bond is, resulting in increase in bond strength. A solder wet spread rate adequate for preventing defective bonding is 40% or more. In the light of improvement in a bonding probability and bonding reliability under various atmosphere, a solder wet spread rate is preferably 45% or more, more preferably 50% or more.

Next, the conditions for measuring a solder wet spread rate (heating at a temperature of 30° C. higher than a melting point of a solder ball for 20 sec) will be described. The temperature must be at least higher than a melting point of a lead-free solder ball such as Sn/3.5Pb (221° C.), Sn-3.0Ag-0.5Cu (217° C.) and Sn-58Bi (139° C.). Furthermore, for reducing variation in wet spreading of the solder ball, the tape is heated at a temperature of 30° C. higher than a melting point of the solder ball in an embodiment of the present invention. A heating time is 20 sec in the light of a time for adequate melting of the flux-active compound for moving to the solder ball surface and wet spreading of the solder ball and furthermore variation in wet spreading of the solder.

A solder wet spread rate is represented by equation (2) and can be determined by the following measuring method.

Definition $$\text{Solder wet spread rate (\%)}=[\{(\text{diameter of a solder ball})-(\text{solder thickness after wet spreading})\}/(\text{diameter of a solder ball})]\times 100 \quad \text{Equation (2)}$$

Measuring Method (1) An adhesive is applied to thickness of 15 μm on a bare Cu plate (Hirai Seimitsu Kogyo Co., Ltd.).

(2) The following solder balls with a diameter of 500 μm are gently placed on the adhesive.

(i) Sn/63Pb (melting point: 183° C., Senju Metal Industry Co. Ltd.)

(ii) M31 (Sn/Ag/Cu, melting point: 217° C., Senju Metal Industry Co. Ltd.)

(iii) L20 (Sn/Bi, melting point: 138° C., Senju Metal Industry Co. Ltd.)

(3) In accordance with ASTM B 545, a hot plate is heated to a temperature of 30° C. higher than a melting point of each solder and on the hot plate, the above sample is heated for 20 sec.

(4) A height of the wet-spreading solder ball on the bare Cu plate is measured.

(5) Using equation (2), a solder wet spread rate is calculated.

In one embodiment of the present invention, an adhesive with a thickness of 100 μm has a melt viscosity of equal to or more than 10 Pa·s and equal to or less than 10000 Pa·s at 223° C. A melt viscosity of 10 Pa·s or more can prevent deterioration of adhesion reliability due to protrusion of an adhesive from an adherend during heating and contamination of surrounding members due to the protrusion. In addition, foaming and defects such as unfilling of an upper and a lower circuit boards can be prevented. Furthermore, it can prevent a problem that excessive wet spreading of a solder causes short circuit between adjacent electrodes. A melt viscosity of 10000 Pa·s or less allow for prevention of defective binding due to elimination of a resin between a solder bump and a circuit board electrode during metal binding of the solder bump and the circuit board electrode. A melt viscosity is preferably equal to or more than 100 Pa·s and equal to or less than 3000 Pa·s, particularly preferably equal to or more than 300 Pa and equal to or less than 1500 Pa·s.

A melt viscosity of an adhesive can be determined by the following measuring method.

Measuring Method

An adhesive with a thickness of 100 μm is subjected to measurement by stress detection under a constant strain using a viscoelasticity measuring instrument (JASCO International Co., Ltd.) in a temperature-increase rate of 30° C./min and a frequency of 1.0 Hz, and a viscosity at an atmospheric temperature of 223° C. which is a melting point of Sn/3.5Ag is measured.

An adhesive of the present invention meets one, preferably two, more preferably all of a copper-oxide reduction rate, a solder wet spread rate and a melt viscosity within the above ranges.

Although the embodiments of the present invention have been described with reference to the drawings, these are only illustrative of the present invention, and various modes other than the above embodiment may be employed.

EXAMPLES

Example 1

Preparation of an Interlayer Adhesive

Forty parts by weight of a bisphenol-A type epoxy resin (Dainippon Ink And Chemicals, Incorporated, EPICLON 840-S), 20 parts by weight of a novolac type phenol resin (Sumitomo Bakelite Co., Ltd., PR-53647), 20 parts by weight of a phenoxy resin (Japan Epoxy Resins Co., Ltd., YL-6954, number average molecular weight: 14500), 20 parts by weight of phenolphthaline (Kanto Chemical Co., Inc., Reagent grade) and 100 parts by weight of acetone were weighed, and mixed and stirred to give an interlayer adhesive. This interlayer adhesive was measured for a copper-oxide reduction rate, a solder wet spread rate and a melt viscosity as described above and the following results were obtained.

Copper-oxide reduction rate: 85%
Solder wet spread rate:
Solder ball
SnPt: 55%
SnAgCu: 52%
SnBi: 54%
Melt viscosity: 1000 Pa·s Preparation of a Circuit Board A circuit board was prepared in accordance with the steps illustrated in FIGS. 1 to 4.

Specifically, in a two-layer one-side circuit board (Ube Industries, Ltd., SE1310) having a copper foil with a thickness of 12 μm and a polyimide film as a base material with a thickness of 25 μm, a via with a diameter of 50 μm was formed by UV laser from the side opposite to the copper foil. A plating height was 23 μm as a protrusion from the base material and a circuit was formed by etching. This substrate having a conductor post and the interlayer adhesive were thermo-compressed in a vacuum laminator under the conditions of 130° C. and 0.1 MPa. Then, a two-layer two-side circuit board (Arisawa Mfg. Co., Ltd., PKW1012ECU) having a copper foil with a thickness of 12 μm and a polyimide film as a base material with a thickness of 25 μm was etched to form a circuit. After lamination with alignment by image processing, the substrate was thermo-compressed by a vacuum press at 218° C. and 2 MPa and then pressed at 225° C. and 1 MPa for 40 sec. Then, it was held at 260° C. and 1 MPa for 5 min.

Example 2

A circuit board was prepared as described in Example 1, except thermocompression was conducted at 220° C. and 2 MPa and pressing was conducted at 221° C. and 1 MPa for 25 sec.

Comparative Example 1

A circuit board was prepared as described in Example 1, except thermocompression was conducted at 218° C. and 2 MPa and pressing was conducted at 225° C. and 1 MPa for 180 sec.

Comparative Example 2

A circuit board was prepared as described in Example 1, except thermocompression was conducted at 218° C. and 5 MPa and pressing was conducted at 225° C. and 5 MPa for 40 sec.

Comparative Example 3

A circuit board was prepared as described in Example 1, except thermocompression was conducted at 218° C. and 5 MPa, pressing was conducted at 225° C. and 5 MPa for 40 sec, and then a substrate was held at 230° C. and 1 MPa for 5 min.

Table 1 shows the evaluation results for the substrates processed by the methods described in Examples 1 and 2 and Comparative Examples 1, 2 and 3. The substrates in Examples 1 and 2 exhibited good performance while the substrates of Comparative Examples 1, 2 and 3 exhibited defective performance.

TABLE 1

|  | Ex. 1 | Ex. 2 | Comp. Ex. 1 | Comp. Ex. 2 | Comp. Ex. 3 |
| --- | --- | --- | --- | --- | --- |
| Bonding rate | ◯ | ◯ | Δ | ◯ | ◯ |
| Connection reliability | ◯ | ◯ | ◯ | ◯ | X |
| Distortion of a circuit | ◯ | ◯ | X | X | ◯ |
| Exudation of an adhesive | ◯ | ◯ | ◯ | X | ◯ |

The invention claimed is:

1. A process for manufacturing a circuit board wherein a first substrate having a conductor post and a second substrate having a conductor pad for receiving said conductor post are laminated through an interlayer adhesive, and said conductor post and said conductor pad are electrically connected, comprising,
    as a first step, bonding said conductor pad with said conductor post by thermocompression under predetermined first conditions while said first and said second substrates are arranged such that said conductor pad faces said conductor post through said interlayer adhesive, wherein said first conditions are a temperature of 210° C. or higher and 220° C. or lower and a pressure of 1 MPa or more and 4 MPa or less;
    thermocompressing said first substrate and said second substrate under predetermined second conditions while said conductor pad is bonded with said conductor post, wherein said second conditions are a temperature of 215° C. or higher and 225° C. or lower and a pressure of 0.3 MPa or more and 2 MPa or less; and
    thermocompressing said first substrate and said second substrate under predetermined third conditions while said conductor pad is bonded with said conductor post, wherein said third conditions are a temperature of 240° C. or higher and 280° C. or lower and a pressure of 0.3 MPa or more and 2 MPa or less.

2. The process for manufacturing a circuit board according to claim 1, wherein said conductor post is covered by a metal covering layer.

3. The process for manufacturing a circuit board according to claim 1, wherein in said first step, said interlayer adhesive between said conductor post and said conductor pad is removed, thereby said conductor post is bonded with said conductor pad.

4. The process for manufacturing a circuit board according to claim 1, wherein in said second step, said conductor post forms a fillet.

5. The process for manufacturing a circuit board according to claim 1, wherein in said third step, said conductor post and said conductor pad alloy.

6. The process for manufacturing a circuit board according to claim 1, wherein the total time of said first step and said second step is 20 sec or more and 120 sec or less.

7. The process for manufacturing a circuit board according to claim 1, wherein the time of said third step is 1 min or more and 10 min or less.

8. The process for manufacturing a circuit board according to claim 1, wherein a thermocompression temperature in said first to third conditions are increased in the order of a temperature in the third conditions, a temperature in the second conditions and a temperature in the first conditions.

9. The process for manufacturing a circuit board according to claim 1, wherein said interlayer adhesive comprises a flux-active compound having a carboxyl group and/or a phenolic hydroxy group, a thermosetting resin and a film-forming resin.

10. The process for manufacturing a circuit board according to claim 9, wherein said thermosetting resin is an epoxy resin.

11. The process for manufacturing a circuit board according to claim 9, wherein said thermosetting resin comprises a curing agent.

12. The process for manufacturing a circuit board according to claim 11, wherein said curing agent is an imidazole compound.

13. The process for manufacturing a circuit board according to claim 9, wherein said film-forming resin is a phenoxy resin or acrylic rubber.

14. The process for manufacturing a circuit board according to claim 9, wherein said interlayer adhesive further comprises a silane coupling agent.

15. The process for manufacturing a circuit board according to claim 9, wherein for said interlayer adhesive, when said interlayer adhesive is applied to the surface of an oxidized copper plate and then reduced in the air at 230° C. for 1 min, a copper-oxide reduction rate of said copper plate represented the below equation is 70% or more Copper-oxide reduction rate (%)={1−(O atom concentration after reduction)/(O atom concentration after oxidation)}×100.

16. The process for manufacturing a circuit board according to claim 9, wherein for said interlayer adhesive, when a tin-containing solder ball with a diameter of 500 μm is placed on said interlayer adhesive and is heated at a temperature higher than a melting point of said solder ball by 30° C. for 20 sec, a solder wet spread rate represented by the below equation is 40% or more Solder wet spread rate (%)=[{(diameter of a solder ball)−(solder thickness after wet spreading)}/(diameter of a solder ball)]×100.

17. The process for manufacturing a circuit board according to claim 9, wherein said interlayer adhesive has a thickness of 100 μm and a melt viscosity at 223° C. of 10 Pa·s or more and 10000 Pa·s or less.

* * * * *